United States Patent [19]

McShane et al.

[11] Patent Number: 5,344,600
[45] Date of Patent: Sep. 6, 1994

[54] METHOD FOR ENCAPSULATING SEMICONDUCTOR DEVICES WITH PACKAGE BODIES

[75] Inventors: Michael B. McShane; Alan H. Woosley; Francis Primeaux, all of Austin, Tex.

[73] Assignee: Motorola, Inc., Schaumburg, Ill.

[21] Appl. No.: 931,459

[22] Filed: Aug. 21, 1992

Related U.S. Application Data

[63] Continuation of Ser. No. 733,580, Jul. 22, 1991, abandoned, which is a continuation-in-part of Ser. No. 362,644, Jun. 7, 1989, Pat. No. 5,049,526.

[51] Int. Cl.⁵ .................... B29C 45/10; B29C 45/14
[52] U.S. Cl. .................... 264/219; 264/272.17; 264/297.2; 425/190; 249/155
[58] Field of Search .......... 264/272.11, 272.15, 264/272.17, 275, 277, 328.7, 294, 328.8, 219, 297.2; 425/185, 186, 190; 249/155, 158

[56] References Cited

U.S. PATENT DOCUMENTS

| | | | |
|---|---|---|---|
| 4,158,910 | 6/1979 | Hanas et al. | 264/328.7 |
| 4,330,248 | 5/1982 | Platte | 425/186 |
| 4,618,466 | 10/1986 | McGlashen | 264/328.7 |
| 4,711,688 | 12/1987 | Pienimaa | 264/272.17 |
| 4,837,184 | 6/1989 | Lin et al. | 264/272.11 |
| 4,915,607 | 4/1990 | Medders et al. | 264/272.17 |
| 5,049,526 | 9/1991 | McShane et al. | 264/272.14 |
| 5,116,450 | 5/1992 | Spoo et al. | 425/185 |
| 5,125,826 | 6/1992 | Vac | 249/155 |
| 5,149,479 | 9/1992 | Nakajima | 264/328.7 |

FOREIGN PATENT DOCUMENTS 60-83820  5/1985  Japan ................. 264/328.7

Primary Examiner—Jan H. Silbaugh
Assistant Examiner—Angela Y. Ortiz
Attorney, Agent, or Firm—Patricia S. Goddard

[57] ABSTRACT

A method of encapsulating a semiconductor device permits use of the same mold for various package types. In one form, a mold (34 and 36) has a first cavity (50) in which a first insert (52 and 53) is positioned, the first insert defining a length and a width of a package body which is to be formed in the mold. The first insert in the first cavity also defines a second cavity (54) in which a second insert (56 and 57) is positioned, the second insert defining a thickness of the package body. Plastic is inserted into the mold to form the package body. To form other package types, one or more inserts are replaced instead of using a different mold. In another embodiment, the inserts are adjustable. For example, rather than having to change inserts to form a package with a different thickness, the inserts are adjusted by, for instance, a screw mechanism (66) within the mold or by the addition or removal of shims (60).

2 Claims, 3 Drawing Sheets

METHOD FOR ENCAPSULATING SEMICONDUCTOR DEVICES WITH PACKAGE BODIES

This application is a continuation of prior application Ser. No. 07/362,644, filed Jul. 22, 1991, now abandoned, which is a continuation-in-part of Ser. No. 07/362,644, filed Jun. 7, 1989, now U.S. Pat. No. 5,049,526.

FIELD OF THE INVENTION

This invention relates generally to the fabrication of semiconductor devices, and more particularly to the fabrication and encapsulation of semiconductor devices using a composite mold with selectable inserts.

BACKGROUND OF THE INVENTION

Semiconductor devices are often encapsulated in a protective plastic body from which a plurality of leads extend to allow electrical contact and interconnection with the encapsulated semiconductor device itself. The protective plastic body is formed by injecting plastic into a mold which surrounds each of a plurality of individual devices and associated leads. The molds which are used to form the plastic packages are very expensive to produce, in part because they must be machined from extremely hard materials such as tool steels, tungsten carbides, and the like. Additionally, the molds themselves are difficult to machine, including very small details which must be precisely implemented. The extremely hard materials are necessary to withstand the abrasive quality of the plastic encapsulating materials. Even the hard materials used for the molds, however, show signs of wear after repeated molding operations. This wear is especially severe along the gates through which the plastic flows as it passes from a source of supply to the individual device sites.

The expense of making the molds argues against proliferation of mold types and also against experimenting with new designs. Despite this, the need for new and complex package types and for expensive new molds to fabricate each of the new packages is ever increasing. As the complexity of the semiconductor device increases, the number of leads necessary for contact and interconnection increases. With the very complex integrated circuit functions presently being implemented in a single packaged device, the number of leads has increased to tens and even hundreds of leads on each device package. The many device leads must be maintained in precise shape, position, and alignment so that the packaged device can be reliably affixed to a printed circuit board or other application. During testing, handling, and other operations there is a high probability that one or more of the large plurality of leads will become bent, misaligned, or moved out of planarity with the other leads. One solution to this problem has been to use a molded carrier ring with the device. A molded carrier ring is a protective ring surrounding and spaced apart from the package body which is molded around and supports the ends of the leads while providing a mechanism for contacting those leads for testing and the like. After the testing and most of the handling has been completed, the molded ring is excised from the packaged device and the leads are cut and formed to their desired, finished form. This cutting and shaping is done at a point in time that is close to the time when the device will actually be placed in operation so that little additional handling must be done. The possibility of misaligning the leads is therefore significantly reduced and the yield to the assembly operation is appreciably enhanced.

The semiconductor industry has standardized a limited number of molded carrier ring configurations. A large number of package types are accommodated with a limited and much smaller number of ring configurations. A variety of different packages use the same ring configuration so that a large proliferation of handling equipment is avoided. This means that a limited number of handler, tester, and other equipment variations are needed to accommodate a large number of package types.

As the concept of molded carrier rings spreads through the industry and replaces a number of existing, non-carrier ring configurations, and as new applications arise, new molds must be generated for each of the new package types and to replace those molds which have excessive wear. This is a very expensive and time consuming endeavor. A need existed, therefore, for a method for fabricating semiconductor devices, especially for the packaging thereof in carrier ring configurations, which would reduce the cost of the molding operation, which would provide flexibility, and which would reduce the cycle time for implementing new package designs.

SUMMARY OF THE INVENTION

The foregoing need and other advantages of the invention are achieved through an improved process in which a standardized mold is adapted to receive inserts to customize the mold. The inserts enable the mold to be used to form a variety of package types and sizes. In accordance with one particular embodiment of the invention, an encapsulation mold is provided having a first cavity formed therein. A first insert is provided in the first cavity such that the first insert defines a length and a width of a package body and also defines a second cavity. A second insert is provided in the second cavity such that the second insert defines a thickness of the package body. A lead frame having a semiconductor die attached thereto is placed in the mold and the mold is filled with plastic to form the package body about the semiconductor die.

DETAILED DESCRIPTION OF A PREFERRED EMBODIMENT

Figure 1:
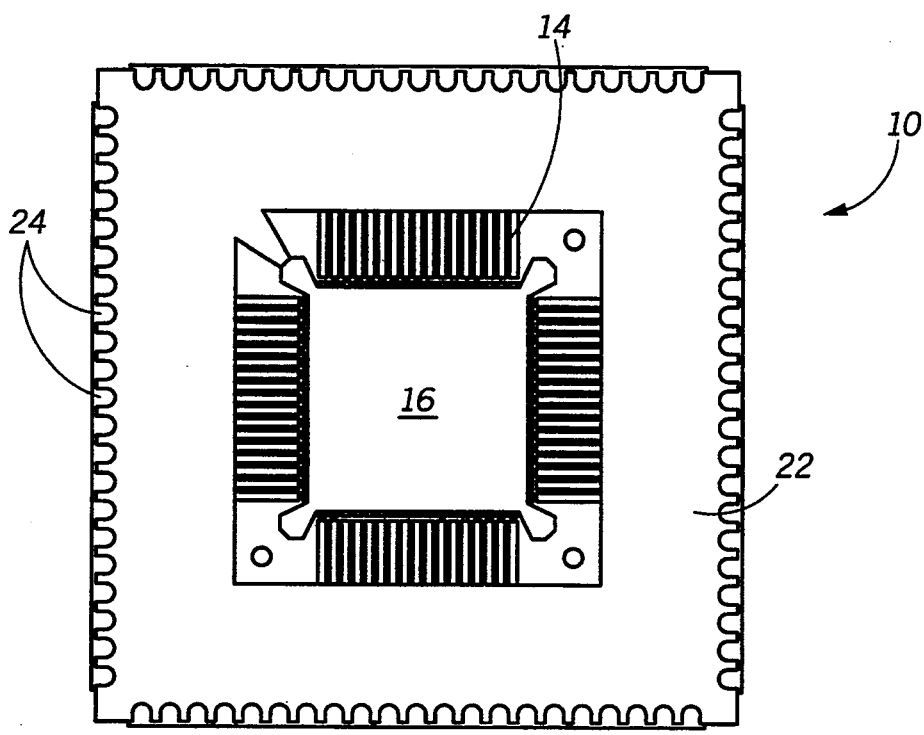
FIGS. 1 and 2 illustrate, in perspective view, two known semiconductor device package configurations each using a standardized carrier ring structure.
Figure 2:
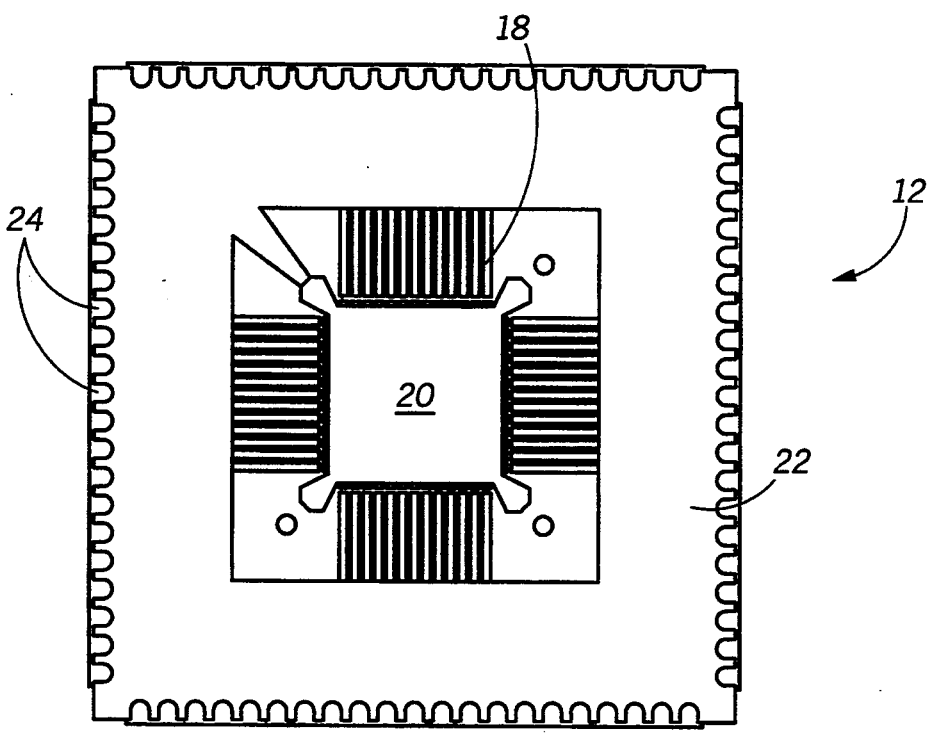

FIGS. 1 and 2 illustrate, in perspective view, semiconductor devices 10 and 12, respectively. Device 10 of FIG. 1 is a conventional sixty-eight lead plastic encapsulated integrated circuit. Leads 14 are arranged in a quad flat pack arrangement. The leads are symmetrically arranged with seventeen of the leads extending outwardly from each side of the package body 16. Similarly, device 12 of FIG. 2 is a conventional fifty-two lead plastic encapsulated integrated circuit device. Leads 18 are again arranged symmetrically, with thirteen leads extending outwardly from each side of a package body 20.

In each of the devices 10 and 12, a conventional molded carrier ring 22 is spaced outwardly from and surrounds each package body. Each of the rings uses the same configuration. Each ring is provided with a total of eighty-four test point locations 24 symmetrically distributed about the outside edge of the ring. The ring size and the number and placement of test point locations is the same for each package. The same ring configuration is used despite the fact that device 10 has sixty-eight leads and device 12 has fifty-two leads. Not all of the test point locations are used with either of these package types, and less test point locations are used with device 12 than are used with device 10. A lead frame appropriate for a particular package type includes outer lead portions which extend outwardly and terminate at the test point locations. Because the test rings are identical for the two devices, the same handling and testing equipment can be used for each device. Ring 22 can be used for any package type having eighty-four or less leads, provided that those leads are reasonably symmetrically distributed. Without the standardized carrier ring, different handling and testing equipment would be required for each different device type.

Figure 3:
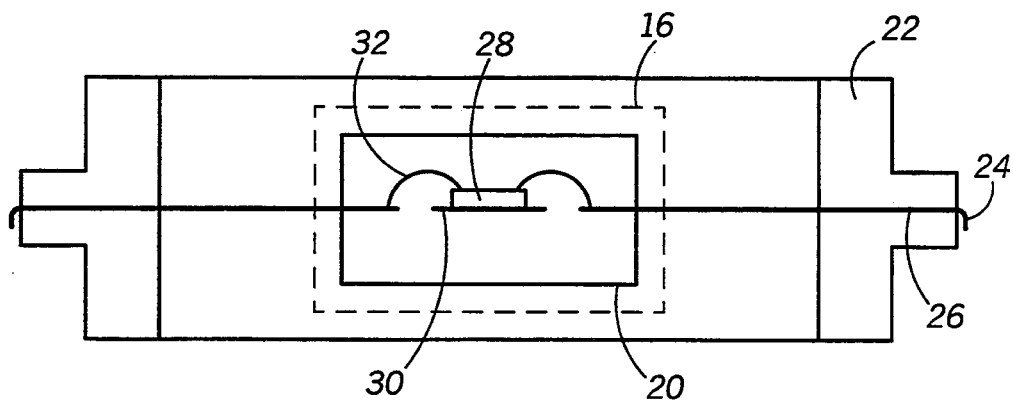
FIG. 3 illustrates, in cross-section, a known semiconductor device package and molded carrier ring.

FIG. 3 illustrates a cross-section through either of the conventional devices illustrated in FIGS. 1 or 2. Illustrated in FIG. 3 is one embodiment of the molded carrier ring 22. The carrier ring surrounds package body 20, or alternatively package body 16 is shown by the dashed lines. This illustrates that the same carrier ring is used to accommodate various package body sizes. Also illustrated, a lead frame 26 extends through package body 20 (or 16) and carrier ring 22 and terminates in test point locations 24. A semiconductor die 28 is bonded to a bonding area 30 of lead frame 26. Fine wires 32 interconnect semiconductor die 28 with individual leads of lead frame 26.

Figure 4:
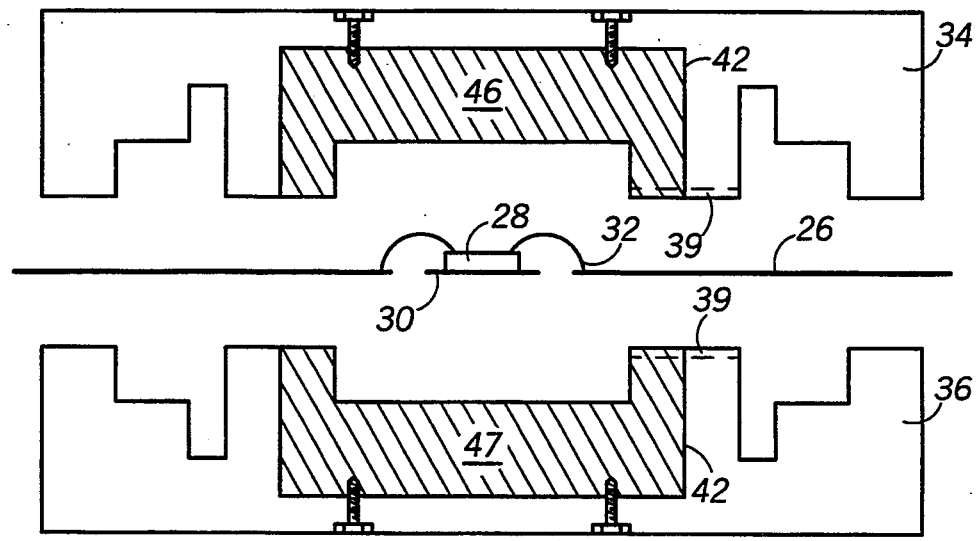
FIGS. 4 and 5 illustrate, in cross-section, one embodiment of a mold structure for use in carrying out a process in accordance with the present invention.

FIG. 4 illustrates a semiconductor device and one embodiment of a plastic encapsulation mold which is used to fabricate and package such a device in accordance with the invention. Semiconductor die 28 is conventionally mounted to the bonding area 30 of lead frame 26. Fine wires 32 are bonded between the semiconductor device die 28 and the individual leads of lead frame 26, as is done in many existing semiconductor devices. The lead frame is placed within a plastic encapsulation mold which, in this embodiment, includes an upper portion 34 and a lower portion 36. Lead frame 26 is properly aligned with the mold portions, usually by a series of alignment holes and keys (not shown).

Figure 5:
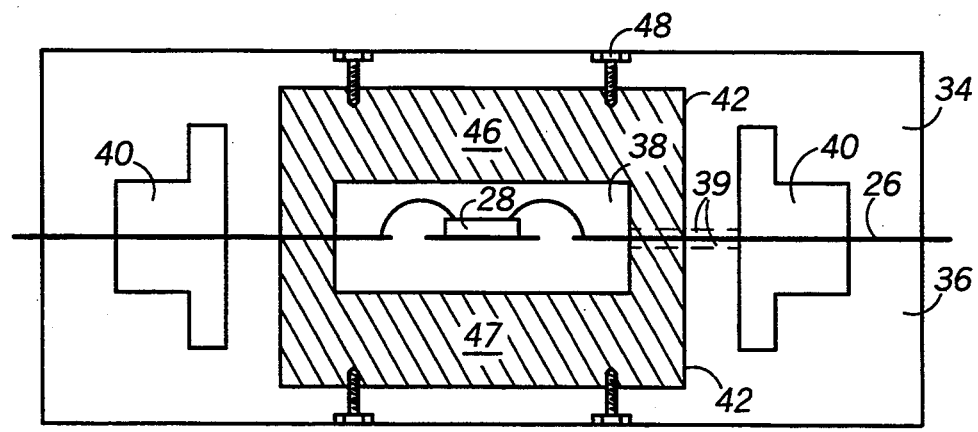

In fabricating a device in accordance with one embodiment of the present invention, the upper and lower portions of the plastic encapsulation mold, 34 and 36 respectively, are brought together to clamp the lead frame as illustrated in FIG. 5. The two mold portions are brought together to define a first cavity 38 and a second cavity 40. While there appears to be two cavities 40 in the cross-sectional view of FIG. 5, only one cavity 40 which completely encircles cavity 38 is present. First cavity 38 provides an encapsulation mold which defines a package body (not shown). Second cavity 40 provides an encapsulation mold for forming a protective carrier ring (not shown) which is spaced apart from and surrounds the package body cavity 38. A mold gate 39 may be used to provide for the flow of plastic encapsulation material between cavities 38 and 40, rather than filling each cavity individually.

Second cavity 40 is a fixed element of the mold and provides a standard carrier ring configuration which is common to a number of different package body types. In accordance with the invention, first cavity 38 can be changed to accommodate a variety of package body types, each with the same carrier ring structure. To change cavity 38 to mold a different plastic package body, the encapsulation mold is constructed with opposing chambers 42 in each of the mold halves. These chambers are designed to accept an insert or, in this embodiment, a pair of inserts 46 and 47, one in upper mold portion 34 and one in lower mold portion 36. The inserts fit snugly into chambers 42 and may be held in place by screws 48 or the like. The inserts, in turn, define the interior cavity space 38.

To encapsulate a semiconductor device in accordance with the invention, a particular insert or set of inserts is selected depending upon the package body type desired, and these inserts are positioned in and secured in the upper and lower mold portions. The mold portions are closed about lead frame 26 having semiconductor die 28 attached thereto. A plastic material, also referred to as molding compound, is injected or transferred into cavities 38 and 40 which are formed by upper and lower mold portions, 34 and 36 respectively, and by inserts 46 and 47. The injected or transferred plastic forms the plastic package body and the molded carrier ring surrounding the package body. A different package body can be accommodated simply by changing mold inserts 46 and 47 without requiring the manufacture of an entire new encapsulation mold.

Figure 6:
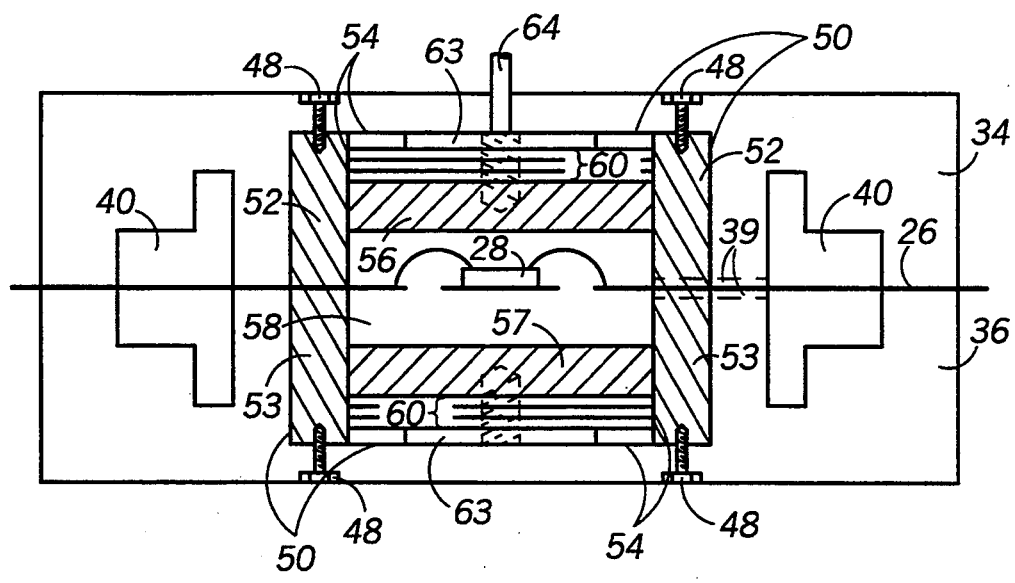
FIGS. 6 and 7 each illustrate, in cross-section, another embodiment of a mold structure for use in carrying out the present invention.

Another embodiment of the present invention is illustrated in FIG. 6, which is a cross-sectional view of a mold structure suitable for carrying out the present invention. This particular embodiment utilizes two separate inserts (or two separate sets of inserts) to further, and more efficiently, customize a package body configuration. Upper portion 34 and lower portion 36 of the mold create cavity 40 which is used to form a molded carrier ring. The mold portions create a cavity or chamber 50. Chamber 50 accommodates a first set of inserts which includes inserts 52 and 53. Inserts 52 and 53 do not completely occupy chamber 50, but instead form a second cavity or chamber 54 contained within chamber 50. To aid in distinguishing chambers 50 and 54 in the figures, it will help to point out that chamber 50 is formed by the upper and lower portions of the mold, 34 and 36 respectively, while chamber 54 is formed by a bottom surface of chamber 50 and by inserts 52 and 53. As illustrated, second chamber 54 is the smaller of the two chambers.

As also illustrated in FIG. 6, a second set of inserts, which includes inserts 56 and 57, occupies chamber 54. Together, the first set of inserts and the second set of inserts form a cavity 58. Cavity 58 defines a package body which is to be formed about semiconductor die 28 and portions of lead frame 26. Inserts 52 and 53 define two dimensions of cavity 58, namely a length and a width of the cavity, while inserts 56 and 57 define a third dimension which is a thickness of the cavity. With respect to FIG. 6, the cavity thickness is measured in a direction which is vertical, while length (or width) is measured in a horizontal direction. Width (or length) of the cavity is measured in a direction which is normal to the cross-sectional plane of FIG. 6. For the purposes of this discussion, length and width of the cavity are interchangeable; however, it should be understood that inserts 52 and 53 define two dimensions, the length and width of the cavity, while inserts 56 and 57 define the third cavity dimension which is thickness. Because cavity 58 defines the shape of a package body formed about semiconductor die 28, inserts 52, 53, 56, and 57 also define the package body dimensions.

The embodiment of the present invention illustrated in FIG. 6 is similar to the FIG. 5 embodiment in that the use of inserts in an encapsulation mold permits a semiconductor device package to be customized while maintaining a standard mold configuration. One difference in the two embodiments is that the two sets of inserts used in FIG. 6 enable the size of cavity 58 to be adjusted without having to change or replace any of the inserts. The first set of inserts, inserts 52 and 53, may be removed from the upper and lower portions of mold, respectively, thereby permitting a different set of inserts to be placed in the mold which modify the length and width of cavity 58. However, the thickness of cavity 58 may be modified without replacing the second set of inserts, inserts 56 and 57. For example, the position of inserts 56 and 57 within chamber 54 may be adjustable by the addition or removal of shims 60. By adding or removing one or more of the shims, the effective height of inserts 56 and 57 is raised or lowered, thereby changing the thickness of cavity 58. Inserts 52 and 53 may be held in the mold by using screws 48 or the like. Similarly, inserts 56 and 57 and shims 60 may be held in place in the mold through the use of bolts 63 or another fastening mechanism. In order to prevent inserts 56 and 57 and shims 60 from warping during high pressure molding operations, bolts 63 are provided with heads which are comparable in size to the shims and the inserts for sufficient support. Also illustrated in FIG. 6 is an optional ejector pin 64 which may be used to push the inserts out from the mold should the inserts need to be removed or adjusted. Ejector pins may be provided in either the upper or lower portion of the mold or in both portions. Ejector pins similar to those traditionally used for removing a packaged semiconductor device from a mold are suitable for removing inserts in accordance with the present invention.

Figure 7:
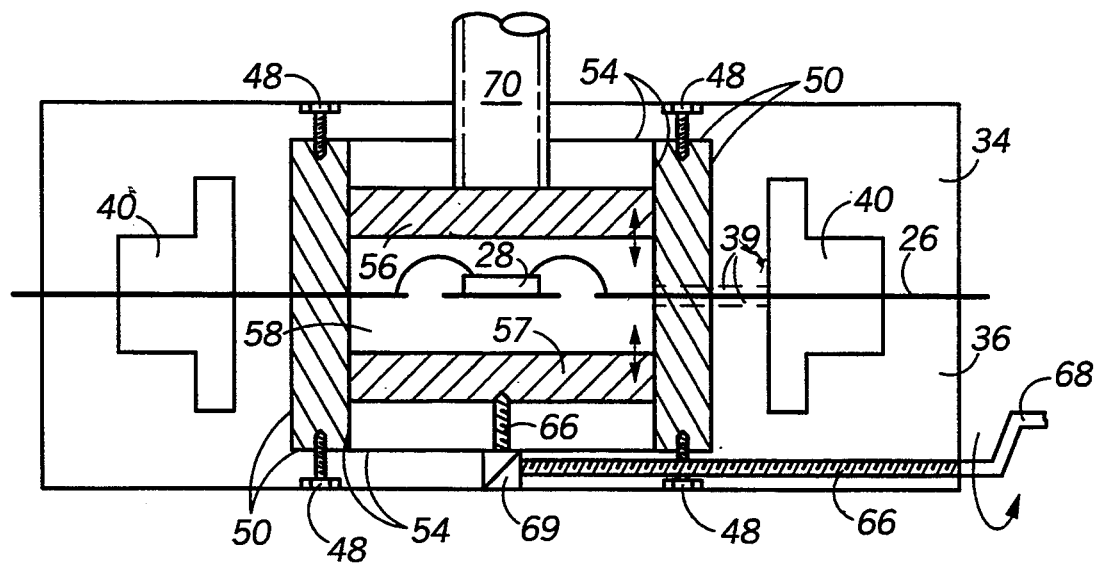

Another method of adjusting the thickness of cavity 58 is by providing a screw mechanism in the mold which adjusts the height of the inserts. An example of such a mechanism is illustrated in a cross-sectional view in FIG. 7. The position of insert 57 is adjustable within chamber 54 by operation of a screw mechanism such as a screw mechanism 66. The screw mechanism is integrated into the lower portion 36 of the mold and extends into chamber 54 and into insert 57. By rotating a handle 68, the screw mechanism raises and lowers insert 57 to adjust the thickness of cavity 58. The horizontal portion of screw mechanism 66 is coupled to a right angle gear mechanism 69 which translates horizontal rotation of the screw mechanism into vertical rotation so that the insert may be raised or lowered. FIG. 7 also illustrates yet another way of adjusting the thickness of cavity 58, that being use of a hydraulic rod mechanism 70. As illustrated, hydraulic rod mechanism 70 is coupled to insert 56 and is used to raise and lower the insert within chamber 54, thereby modifying the thickness of cavity 58. Although FIG. 7 illustrates a mold which utilizes two types of insert adjustments, namely a screw mechanism and a hydraulic rod mechanism, one will use the same type of mechanism for both the upper and lower portions of a mold in a preferred form. Furthermore, one may desire to have only one portion of the mold, either the upper or the lower portion, accommodate inserts or insert adjustment mechanisms.

The foregoing description and illustrations contained herein demonstrate many of the advantages associated with the present invention. In particular, it has been revealed that use of the present invention enables a variety of package types to be formed using one mold, thereby significantly reducing tooling costs normally associated with producing a wide variety of package types. The ability to form several package configurations with a single mold is advantageous not only in semiconductor devices which utilize a standard carrier ring, but also with devices which do not utilize ring structures. By using two inserts (or two sets of inserts), at least one of which is adjustable, various package dimensions can be changed without have to change or replace inserts. For example, a first insert may be used to define a package length and width, while a second insert may define a package thickness. To adjust the thickness of the package without having to change inserts, the second insert is provided with a mechanism which alters the position of the insert within the mold, thereby changing the package thickness. Any of several mechanisms may be used to adjust the position of the inserts including, but not limited to, screw mechanisms, hydraulic mechanisms, and the use of shims.

Thus it is apparent that there has been provided, in accordance with the invention, a method for fabricating a semiconductor device and for the encapsulation of a semiconductor device, either with or without a molded carrier ring, which fully meets the need and advantages set forth above. Although the invention has been described and illustrated with reference to specific embodiments thereof, it is not intended that the invention be limited to these illustrative embodiments. For example, different mold configurations are considered within the scope of the invention. The mold described herein has been merely illustrative of the type of mold actually used in encapsulating a semiconductor device. As an example, rather than using inserts in both the upper and lower portions of an encapsulation mold, the present invention can be implemented using inserts in only one-half of the mold. Further, in actual operation the lead frame usually provides for a plurality of semiconductor devices to be mounted along a lead frame strip. The mold used for encapsulating this plurality of semiconductor devices thus includes a plurality of sets of chambers, each set designed to provide a package body and, if desired, a surrounding carrier ring. The number of chambers used in a mold can be varied, as can the numbers of gates. It is also noted that a TAB tape lead frame or the like may be used in accordance with the invention. Furthermore, it is important to understand that the invention is not limited to use with semiconductor devices having molded carrier rings. Semiconductor devices without carrier rings may be fabricated in accordance with the invention such that package thickness of the device may be changed without having to modify a mold or replace inserts. In addition, the present invention is not restricted to the types of insert adjustment mechanisms described or illustrated herein. Therefore, it is intended that this invention encompass all such variations and modifications as fall within the scope of the appended claims.

We claim:

1. A method for encapsulating semiconductor devices, each device including a package body, the method comprising the steps of:

providing a mold having at least one mold platen, the mold platen having a first cavity formed therein;

providing a first insert in the first cavity which defines a width and a length of a first package body, the first insert also defining a second cavity;

providing a second insert in the second cavity and within the first insert which defines a thickness of the first package body, the second insert having an adjustable position within the first insert;

providing a lead frame;

attaching a semiconductor die to the lead frame;

inserting the lead frame with the semiconductor die attached thereto into the mold;

filling an encapsulant into the mold including the second cavity in the second insert to form the first package body which encapsulates the semiconductor die, while keeping the first and second inserts stationary;

removing the lead frame, the semiconductor die, and the first package body from the mold; and adjusting the second insert within the first insert such that the second insert defines a thickness of a second package body which is different than the thickness of the first package body, wherein the second insert is adjusted while the first insert is held stationary;

wherein the mold is provided with means to adjust the position of the second insert within the second cavity, and wherein the means to adjust comprises at least one shim within the second cavity.

2. A method for encapsulating semiconductor devices, each device including a package body and a molded carrier ring surrounding each package body, the method comprising the steps of:

providing a mold having at least one mold platen, the mold platen having a first cavity for defining a carrier ring shape and having a second cavity for accepting a first insert of predetermined dimensions, the first insert defining one of a plurality of user selectable package body widths and lengths and defining a third cavity within the second cavity for accepting a second insert of predetermined dimensions, the second insert defining a fourth cavity which determines a first one of a plurality of user selectable package body thicknesses and having an adjustable position within the third cavity to permit variation of the package body thickness;

providing one or more shims which are positioned in the third cavity, the one or more shims determining the position of the second insert within the third cavity;

providing a lead frame;

attaching a semiconductor die to the lead frame;

inserting the lead frame with the semiconductor die attached thereto into the mold;

filling the fourth cavity formed by the second insert with plastic to form a package body which encapsulates the semiconductor die while keeping the first and second inserts stationary;

filling the first cavity in the mold with plastic to form a molded carrier ring which surrounds the package body;

removing the lead frame, the semiconductor die, and the package body from the mold; and adjusting the second insert within the first insert such that the second insert defines a second one of the plurality of user selectable package body thickness which is different than the first one of the plurality of user selectable package body thicknesses, wherein the second insert is adjusted while the first insert is held stationary.

* * * * *